United States Patent
Gardner et al.

(10) Patent No.: US 11,695,058 B2
(45) Date of Patent: Jul. 4, 2023

(54) METHOD OF EXPANDING 3D DEVICE ARCHITECTURAL DESIGNS FOR ENHANCED PERFORMANCE

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 182 days.

(21) Appl. No.: 17/189,674

(22) Filed: Mar. 2, 2021

(65) Prior Publication Data

US 2021/0343857 A1 Nov. 4, 2021

Related U.S. Application Data

(60) Provisional application No. 63/019,015, filed on May 1, 2020.

(51) Int. Cl.
*H01L 29/66* (2006.01)
*H01L 29/78* (2006.01)
*H10B 41/27* (2023.01)
*H10B 43/27* (2023.01)

(52) U.S. Cl.
CPC .... *H01L 29/66666* (2013.01); *H01L 29/7827* (2013.01); *H10B 41/27* (2023.02); *H10B 43/27* (2023.02)

(58) Field of Classification Search
None
See application file for complete search history.

(56) References Cited

U.S. PATENT DOCUMENTS

2021/0366904 A1* 11/2021 Gardner .......... H01L 21/823814

* cited by examiner

*Primary Examiner* — Hsien Ming Lee
(74) *Attorney, Agent, or Firm* — Oblon, McClelland, Maier & Neustadt, L.L.P.

(57) ABSTRACT

Aspects of the present disclosure provide a vertical channel 3D semiconductor device sand a method for fabricating the same. The 3D semiconductor devices may have vertical channels of the same or different epitaxially grown doped materials. Sidewall structures are formed around each vertical channel by masking and etching material between the vertical channels. A dielectric layer in each of the sidewalls is etched down to the vertical channel and a gate electrode structure is formed in the opening. The gate electrode structure may include an interfacial oxide, a high-K layer and alternating metal layers. Local interconnects connect to the metal of the gate structure.

20 Claims, 23 Drawing Sheets

METHOD OF EXPANDING 3D DEVICE ARCHITECTURAL DESIGNS FOR ENHANCED PERFORMANCE

CROSS REFERENCE TO RELATED APPLICATIONS

This present disclosure claims the benefit of U.S. Provisional Application No. 63/019,015, filed on May 1, 2020, which is incorporated herein by reference in its entirety.

FIELD OF THE INVENTION

This disclosure relates to microelectronic devices including vertical channel semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate.

Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of one another.

3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is desired.

Accordingly, it is one object of the present disclosure to provide methods and devices for vertical transistors which can be stacked on top of one another.

SUMMARY

Techniques herein include methods of microfabrication of 3D devices that expand 3D device architectural designs for enhanced performance, and that enable higher density circuits to be produced at reduced cost. Vertical 3D epitaxial growth for vertical transistors allows current flow in a vertical dimension or perpendicular to wafer surface. Methods and designs herein include making CMOS devices with upright current flow. Vertical 3D devices herein enable another degree of freedom in the z-direction that will augment existing 3D devices for layout options. Having relatively short transistor lengths is achieved because channel length is defined by a deposited layer or epitaxially grown layer. Precise alignment with gate electrodes is achieved by selective removal of intermediate dielectric layers. Techniques herein eliminate a need for oxide isolation of a 3D nano stack.

A first embodiment describes a method of microfabrication, comprising: forming a stack of dielectric layers on a first layer of semiconductor material, the stack of dielectric layers having at least three layers in which a first dielectric material is positioned below and above a second dielectric material, the first dielectric material being different from the second dielectric material in that the second dielectric material can be removed without removing the first dielectric material; forming openings in the stack of dielectric layers such that the first layer of semiconductor material is uncovered; epitaxially growing channel material within uncovered openings to form vertical channels; removing a portion of the stack of dielectric layers such that sidewall structures remain on the vertical channels; removing the second dielectric material from the sidewall structures such that sidewall surfaces of the vertical channels are uncovered; and forming a gate structure on uncovered sidewall surfaces of the vertical channels.

A second embodiment describes a semiconductor device, comprising: a substrate layer; a first layer of a first dielectric material; a first layer of semiconductor material; a stack of dielectric layers having at least three layers in which the first dielectric material is positioned below and above a second dielectric material, the first dielectric material being different from the second dielectric material in that the second dielectric material can be removed without removing the first dielectric material; first openings in the stack of dielectric layers in which the first layer of semiconductor material is uncovered; vertical channels having epitaxially grown doped material in the first openings; sidewall structures formed by second openings in the stack of dielectric layers between the vertical channels; third openings in the sidewall structures formed by removal of the second dielectric material to the vertical channel; gate structures in the third openings; and local interconnects connected to the gate structure of each vertical channel, the vertical channels configured to conduct current perpendicular to a working surface of the substrate.

Of course, the order of discussion of the different steps as described herein has been presented for the sake of clarity. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1A:
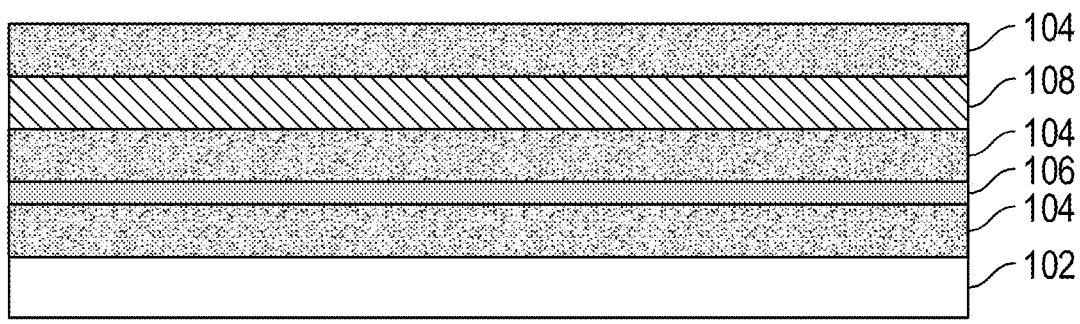
FIG. 1A is a cross-sectional substrate segment showing deposited layers of different dielectric types, according to an embodiment of the present disclosure.

Referring now to the drawings, wherein like reference numerals designate identical or corresponding parts throughout the several views.

Techniques herein include methods of microfabrication of 3D devices that expand 3D device architectural designs for enhanced performance, and that enable higher density circuits to be produced at reduced cost. Vertical 3D epitaxial growth for vertical transistors allows current flow in a vertical dimension or perpendicular to wafer surface. Methods and designs herein include making CMOS devices with upright current flow. Vertical 3D devices herein enable another degree of freedom in the z-direction that will augment existing 3D devices for layout options. Having relatively short transistor lengths is achieved because channel length is defined by a deposited layer or epitaxially grown layer. Precise alignment with gate electrodes is achieved by selective removal of intermediate dielectric layers. Techniques herein eliminate a need for oxide isolation of a 3D nano stack. Vertical transistor can have unlimited W with GAA devices with particular substrate conditions.

Because the gate electrode and source regions have 360 degree access, a contact may be placed at any side of the source or any side of the gate. The source and drain may be interchanged because each channel can be isolated from other channels. 360 degree access is a significant benefit with the device architecture for maximum layout connections and routing. Given channel regions can be centered on the S/D epitaxial region or offset for maximum layout efficiency depending on circuit requirements. Vertical 3D structures provide accessible (360 degree contact and routing access to channel, source and drain) thereby increasing circuit density.

Example embodiments here will describe several flows referencing the drawings. FIGS. 1A-1L illustrate a single vertical single crystal (or large grain boundary) NMOS gate-all-around (GAA) device using a substrate containing silicon/oxide/silicon stack for an NFET device. FIGS. 2A-2L illustrate single vertical single crystal (or large grain boundary) PMOS gate-all-around (GAA) device using a substrate containing silicon/oxide/silicon stack for a PFET device. FIGS. 3A-3V illustrate CMOS formation with dual epitaxial growth using single crystal GAA devices (NMOS and PMOS) side-by-side.

Referring now to FIG. 1A, a substrate 102 is prepared with a layer stack. This can included alternating layers of a first dielectric 104 and a second dielectric 108. Dielectrics are selected to be etch selective to each other. Dielectrics may be SiN, silicon oxide, silicon dioxide, silicon carbide, or the like. For example, a given isotropic or vapor phase etch can etch one dielectric without etching (substantially etching) the other dielectric. In one example embodiment, the first dielectric 104 is silicon dioxide while the second dielectric 108 is a high-K dielectric. High-K dielectrics may be $Al_2O_3$, AlN, $ZrO_2$, $HfO_2$, $HfSiO_x$, ZrSiOx, HfOxNy, ZrOxNy, HfxZryOz, Ta2O5, La2O3, Y2O3, Nb2O5, TiO2, Pr2O3, $Gd_2O_3$, SiBN, BCN, hydrogenated boron carbide, or the like In this stack, on the bulk substrate 102 material, oxide is deposited, then a layer of semiconductor material 106 is deposited on the oxide. This can be silicon or germanium or other N+ semiconductor material. It can be deposited as amorphous and then crystallized by bake or laser anneal. This layer can be formed with N+ dopants or implanted with N+ dopants. The N+ dopants can be, for example, arsenic or phosphorous, among others. Above this semiconductor layer, a dielectric layer stack is formed of alternating layers. The dielectric layer stack at least includes a first dielectric 104 isolating a second dielectric 108. Subsequently this will enable uncovering a channel while maintaining spacing from source/drain regions.

Figure 1B:
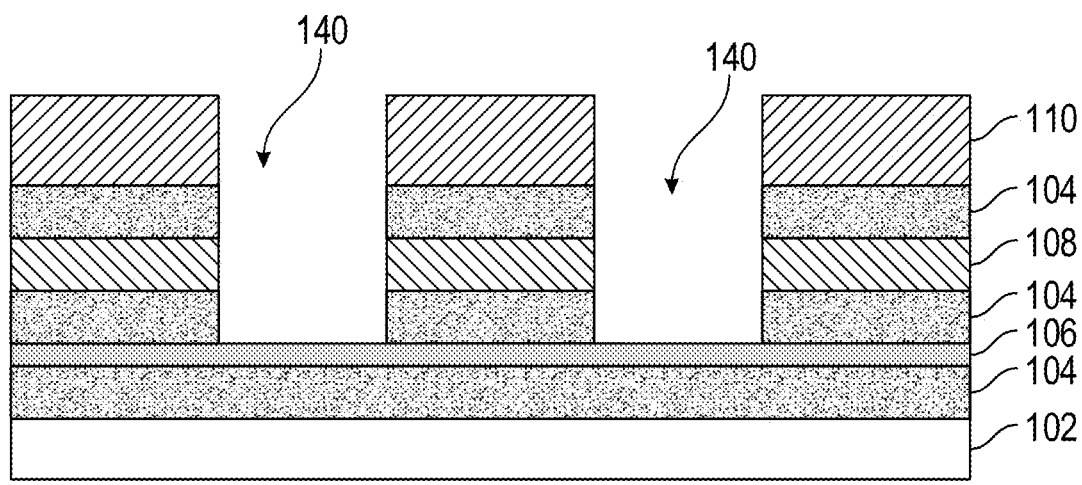
FIG. 1B is a cross-sectional substrate segment showing the formation of an etch mask to define openings in the layer stack, according to an embodiment of the present disclosure.

In FIG. 1B, a photoresist 110 is used to form an etch mask on the layer stack. A photoresist is a light-sensitive material used in photolithography to form a patterned coating on a surface. This etch mask defines openings to form in the layer stack. This opening can be circular, square/rectangular or other channel cross-sectional shape. A directional/anisotropic etch is executed using this etch mask to remove uncovered portions 140 of the layer stack until reaching and uncovering the layer of semiconductor material 106. The masking layer(s) 110 can then be removed.

Figure 1C:
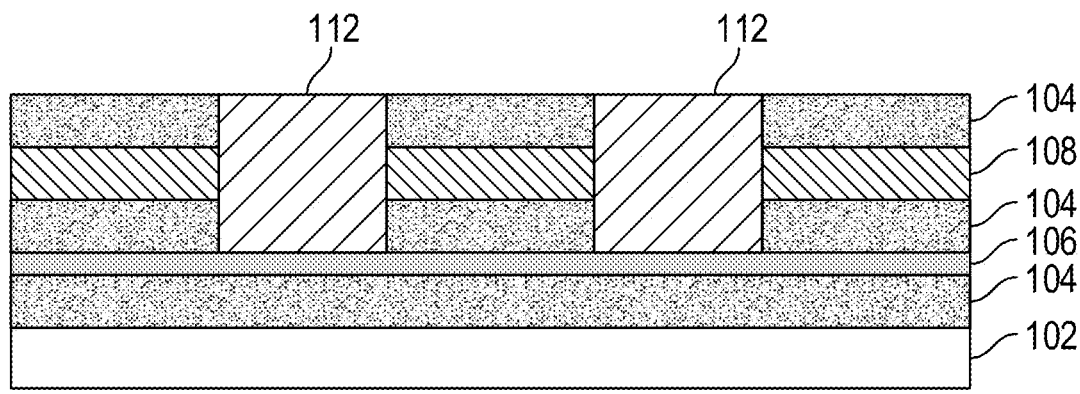
FIG. 1C is a cross-sectional substrate segment showing the epitaxial growth of N+ channel material in the openings, according to an embodiment of the present disclosure.

With the N+ material uncovered within openings, N+ channel material 112 can be grown by epitaxial growth as shown in FIG. 1C. Because the deposited channel length is defined by physical deposition, channel lengths herein can be as short as 10 Angstroms. For channel lengths considered relatively short, these lengths can be approximately 20 A to 100 A. As can be appreciated, channel lengths in the 10s or 100s of nanometers are also contemplated. The longer lengths can provide relaxed scaling dimensions.

Figure 1D:
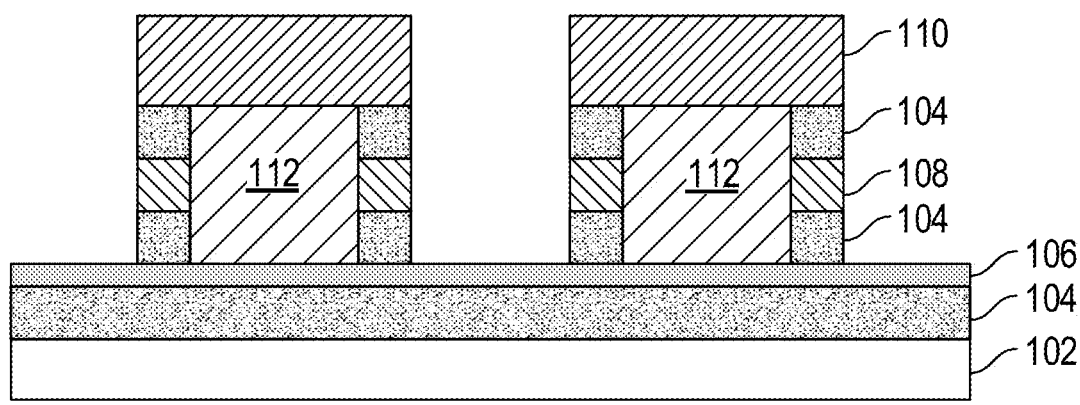
FIG. 1D is a cross-sectional substrate segment showing a second etch mask formed to define sidewall structures around the epitaxially grown vertical channels, according to an embodiment of the present disclosure.

In FIG. 1D, a second etch mask of photoresist 110 is formed to define sidewall structures around the epitaxially grown vertical channels 112. An etch is executed leaving sidewall structures on the vertical channels. The sidewall structures have a particular thickness and keep the alternating dielectric layer stack, essentially surrounding the vertical channel. This etch defines a future gate electrode region.

Figure 1E:
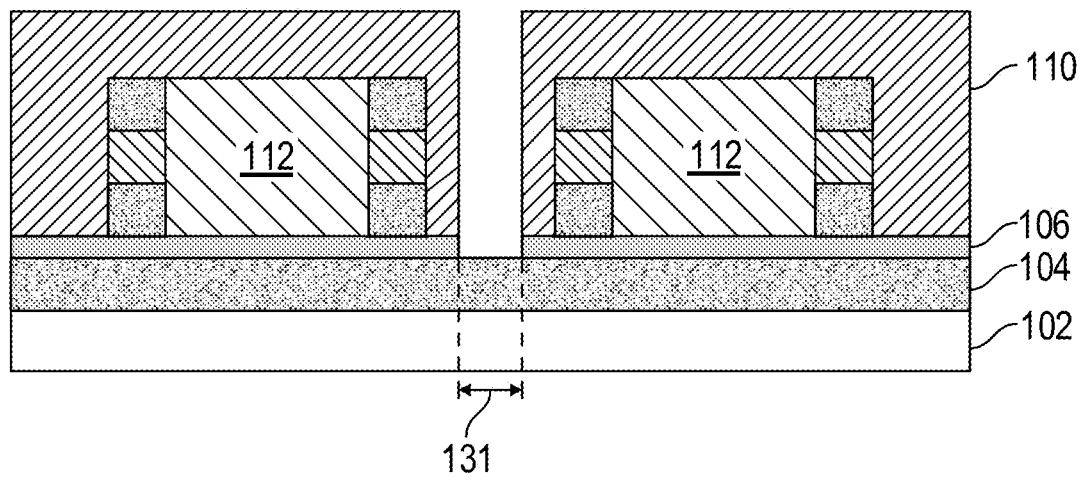
FIG. 1E is a cross-sectional substrate segment showing an optional etch through the N+ silicon layer to isolate the devices, according to an embodiment of the present disclosure.

In FIG. 1E, the existing photoresist 110 from FIG. 1D is removed and a new pattern of photoresist 110 is applied to etch through the N+ silicon layer to isolate each device with opening 131. This isolates each device for maximum circuit applications. This step is optional. In other embodiments, the photoresist mask 110 for defining sidewall structures of FIG. 1D can also be used to isolate N+ silicon.

Figure 1F:
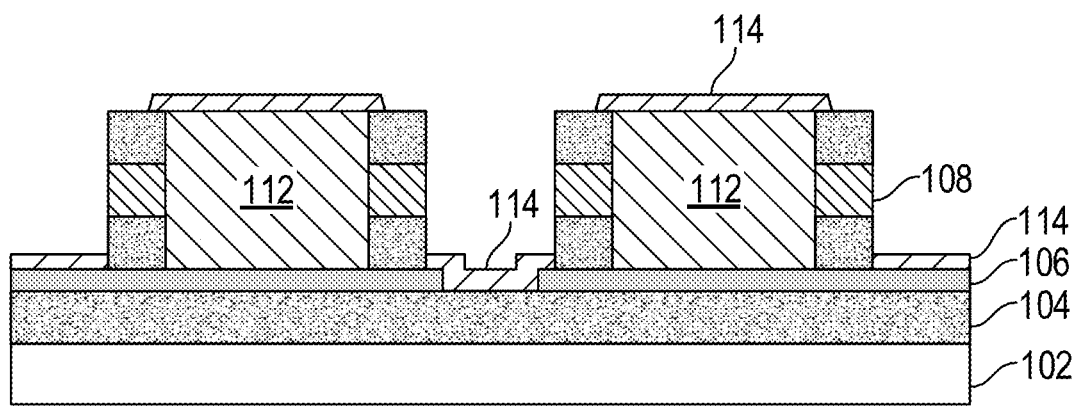
FIG. 1F is a cross-sectional substrate segment showing a third dielectric grown or selectively deposited on open substrate regions and N+ regions, according to an embodiment of the present disclosure.

FIG. 1F, the photoresist 110 has been removed and a third dielectric 114 is grown or selectively deposited on open substrate regions and N+ regions. The third dielectric 114 should be etch selective to the second dielectric 108. Non-limiting examples of dielectric materials that are selective to each other are $Si_xO_y$, $Si_xN_y$, and $SiO_xN_y$, high-K, and (high-K) $O_xN_y$.

Figure 1G:
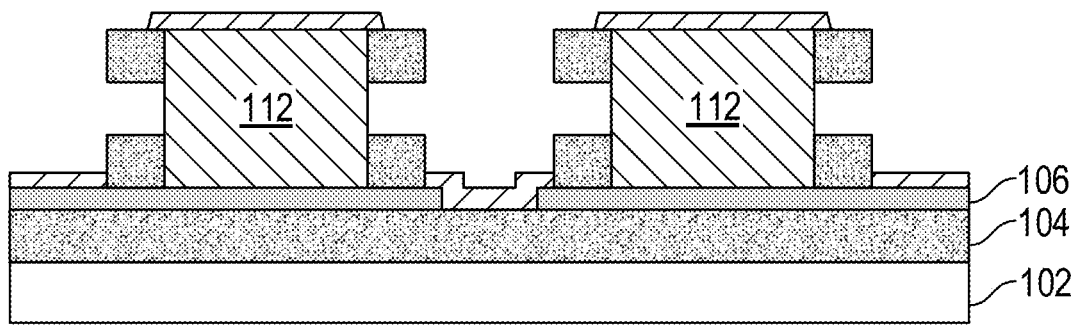
FIG. 1G is a cross-sectional substrate segment showing removal of the second dielectric, according to an embodiment of the present disclosure.

In FIG. 1G, the second dielectric 108 is removed without removing the first dielectric or the third dielectric. This uncovers future gate electrode regions.

Figure 1H:
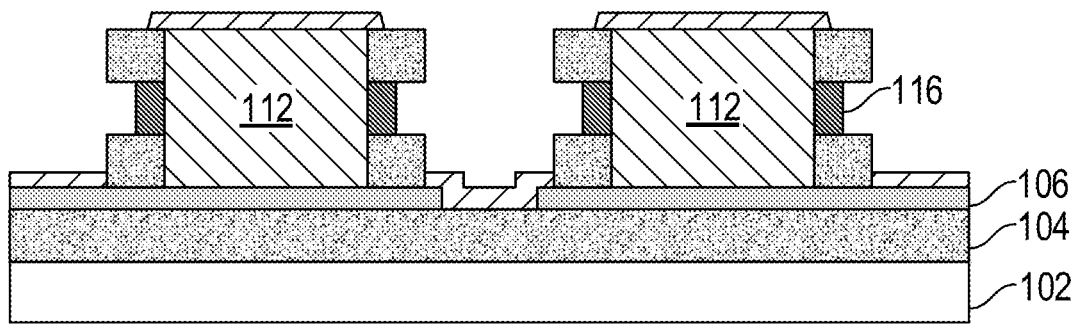
FIG. 1H is a cross-sectional substrate segment showing deposition of a selective high-K layer in the gate regions, according to an embodiment of the present disclosure.

In FIG. 1H, any sacrificial oxide or interface oxide growth can be removed or cleaned followed by deposition of a selective high-K layer 116.

Figure 1I:
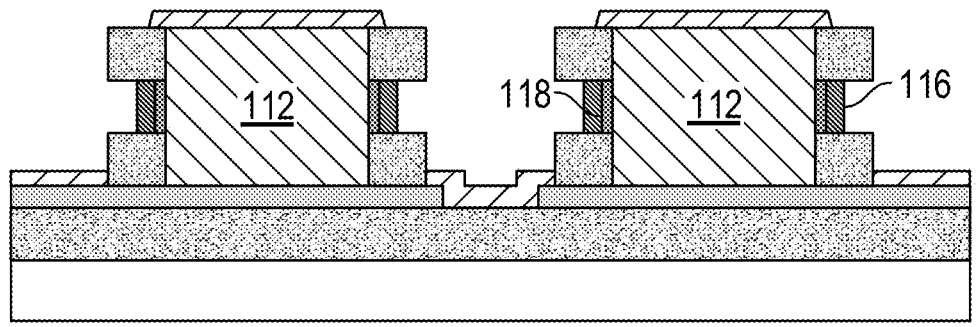
FIG. 1I is a cross-sectional substrate segment showing a selective high-K anneal step forming interfacial oxide growth in the gate regions, according to an embodiment of the present disclosure.

In FIG. 1I, a selective high-K anneal step can be executed. Interfacial oxide growth 118 can be formed between the high-K layer and the vertical channel.

Figure 1J:
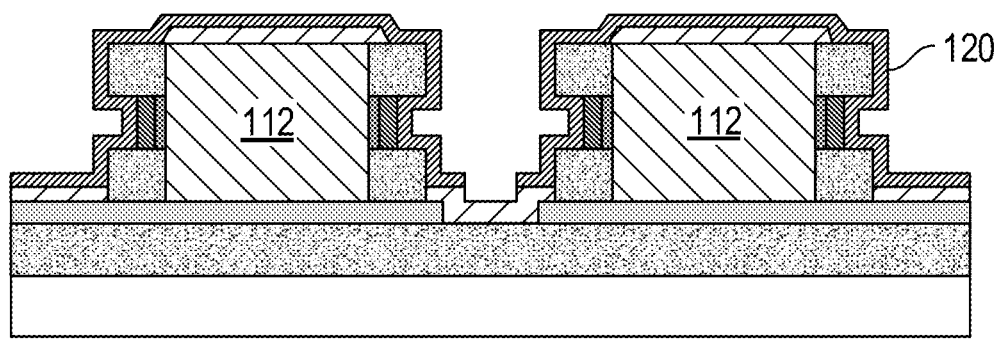
FIG. 1J is a cross-sectional substrate segment showing formation of a metal gate electrode stack, according to an embodiment of the present disclosure.

In FIG. 1J, a metal gate electrode stack 120 can be formed/deposited on the substrate. This can be one layer or multiple layers to adjust the voltage threshold ($V_t$) of the transistor device. This can be a conformal deposition.

Figure 1K:
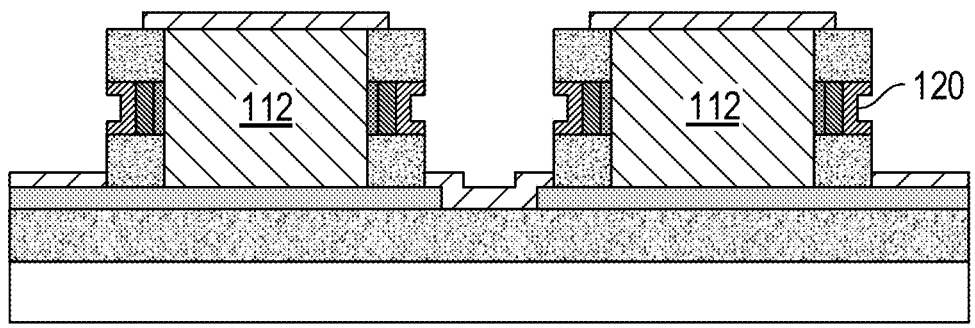
FIG. 1K is a cross-sectional substrate segment showing a directional etch removing gate stack material from the substrate, leaving gate stack materials surrounding the vertical channel to form a GAA device, according to an embodiment of the present disclosure.

In FIG. 1K, a directional etch is executed to remove gate stack material 120 from the substrate, leaving gate stack materials surrounding the vertical channel, thereby forming a GAA device. Processing can then continue such as by forming local interconnects or other connections (not shown). Additional vertical channel GAA devices can be formed on top of the layer of devices to repeat the fabrication process (not shown).

Figure 1L:
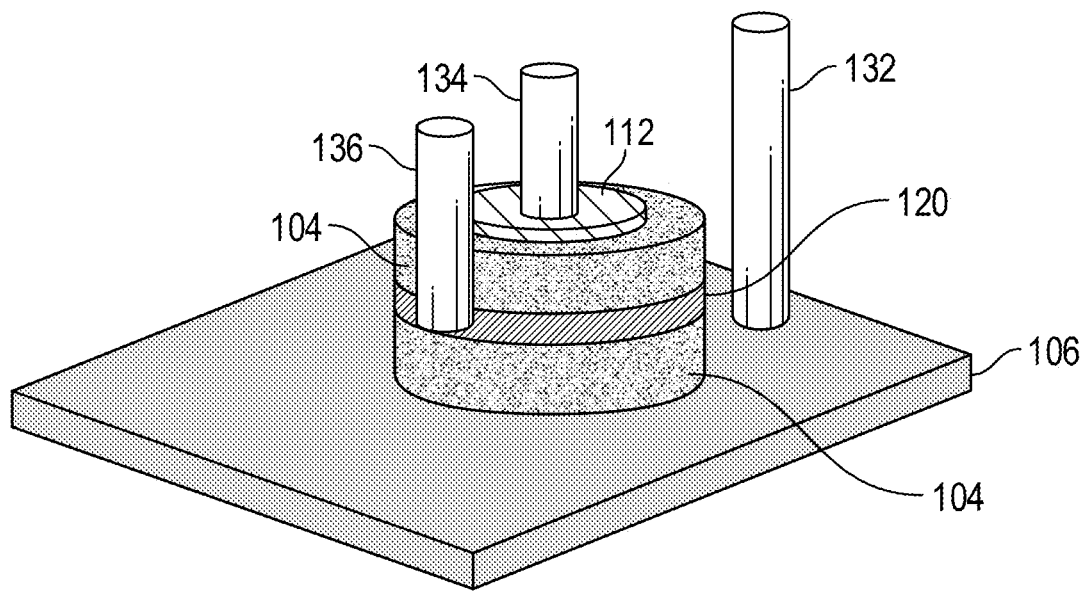
FIG. 1L is a perspective view of an NMOS GAA device with gate, source and drain connected to metal contacts, according to an embodiment of the present disclosure.

FIG. 1L is a perspective view of a device formed by the process of FIG. 1A-1K. FIG. 1L shows the first layer of semiconductor material 106, a layer of dielectric 104, the metal gate electrode stack 120, a layer of dielectric 104 and the N+ epitaxial vertical channel 112. Metal connections 132, 134 and 136 are attached to the first layer 106, the N+ epitaxial vertical channel 112 and the metal gate electrode stack 120 respectively.

FIGS. 2A-2K show a similar flow for formation of PFET devices. Processing flow is similar except that a P-doped silicon or germanium layer 122 can be formed instead of an N-doped layer. Otherwise, masking, sidewall structure formation, and gate electrode formation are similar.

Figure 2A:
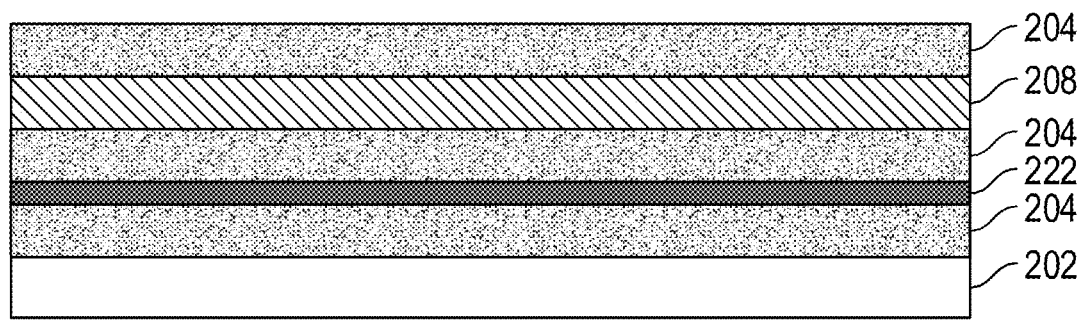
FIG. 2A is a cross-sectional substrate segment showing deposited layers of different dielectric types, according to an embodiment of the present disclosure.
Figure 3A:
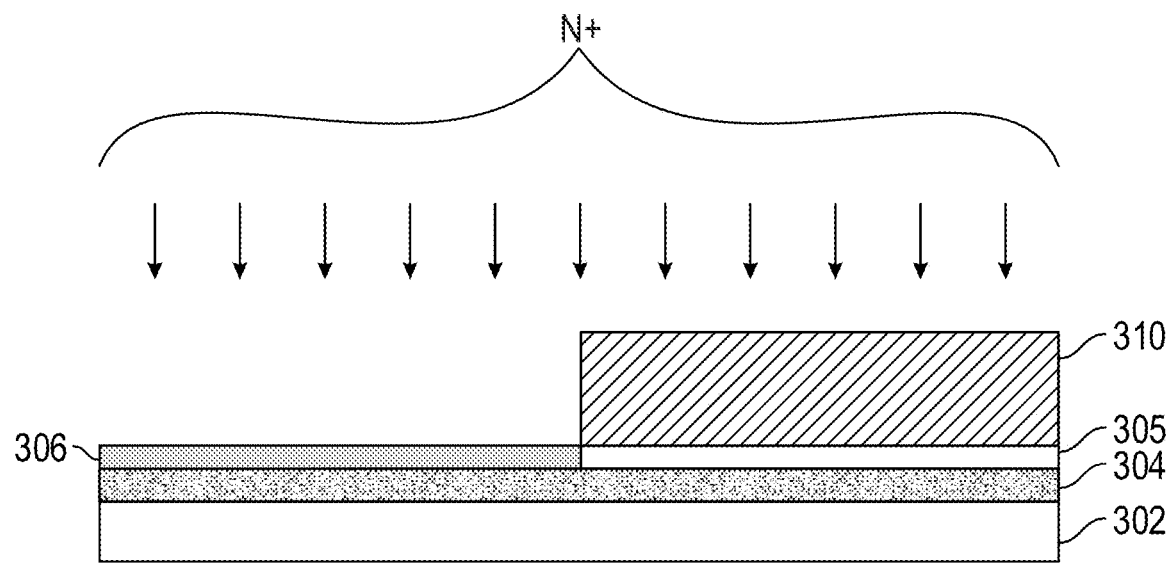
FIG. 3A is a cross-sectional substrate segment showing a substrate of single-crystal silicon on oxide on silicon patterned on one side with a photomask and implanted on the other side with N+ doping, according to an embodiment of the present disclosure.
Figure 3B:
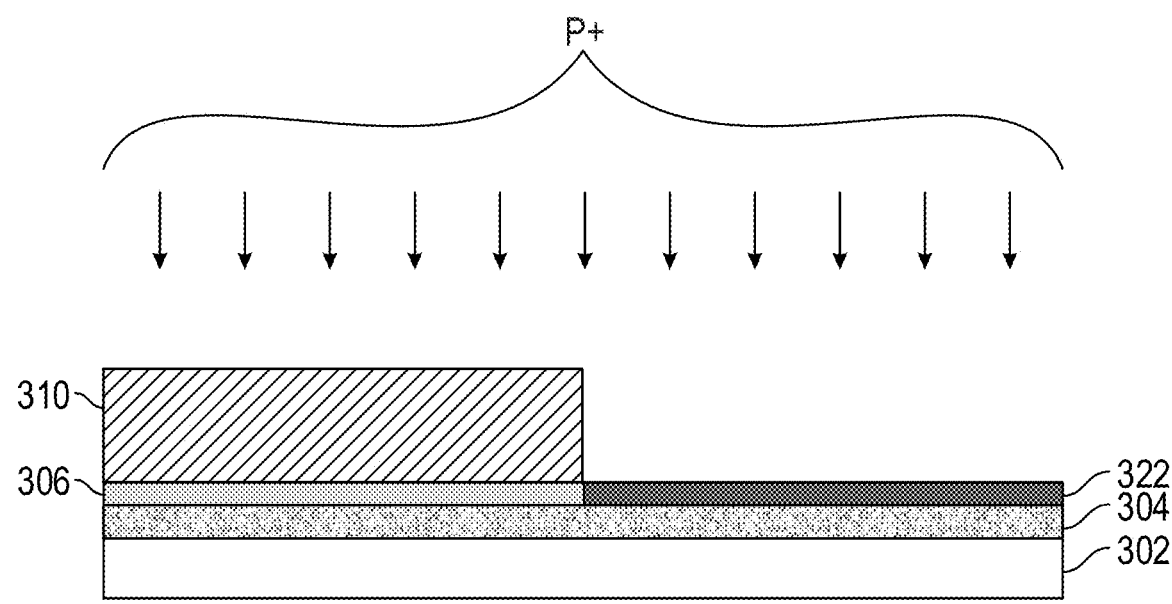
FIG. 3B is a cross-sectional substrate segment showing masking and P+ implant doping on the other side of the substrate layer, according to an embodiment of the present disclosure.
Figure 3C:
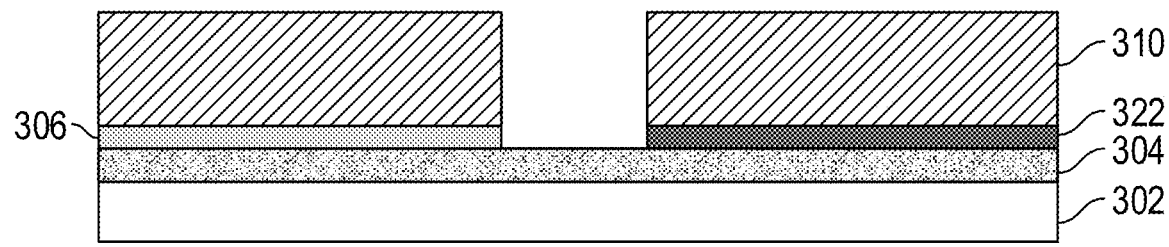
FIG. 3C is a cross-sectional substrate segment showing an optional step of isolating the doped semiconductor regions by masking and etching down to the dielectric oxide layer, according to an embodiment of the present disclosure.
Figure 3D:
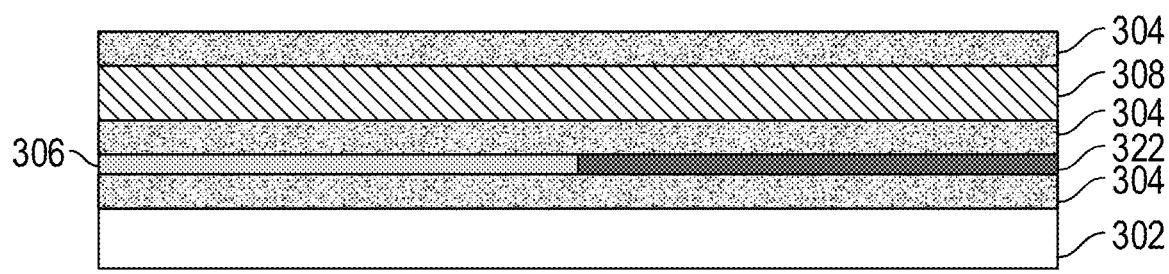
FIG. 3D is a cross-sectional substrate segment showing annealing of implanted regions followed by deposition of a first dielectric layer, a second dielectric layer and a layer of the first dielectric, according to an embodiment of the present disclosure.
Figure 3E:
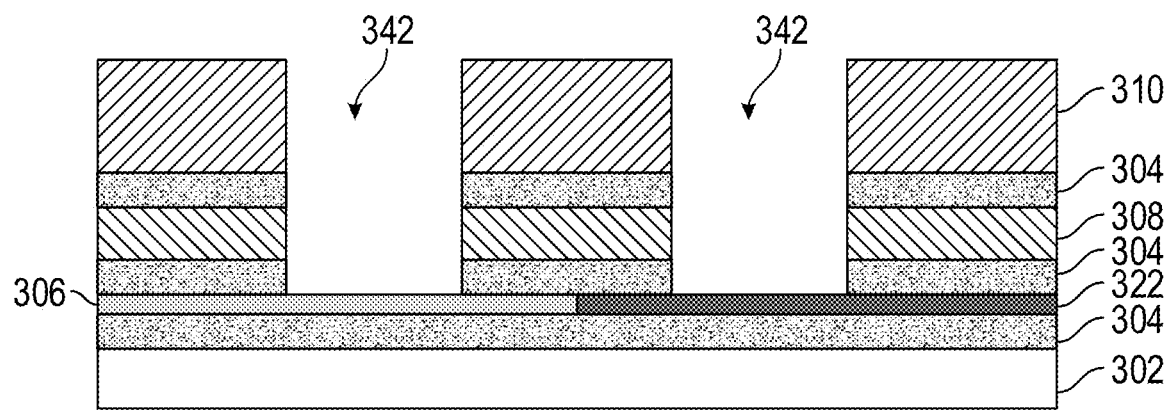
FIG. 3E is a cross-sectional substrate segment showing patterning a photoresist to define openings which are etched down to the doped layer, according to an embodiment of the present disclosure.
Figure 3F:
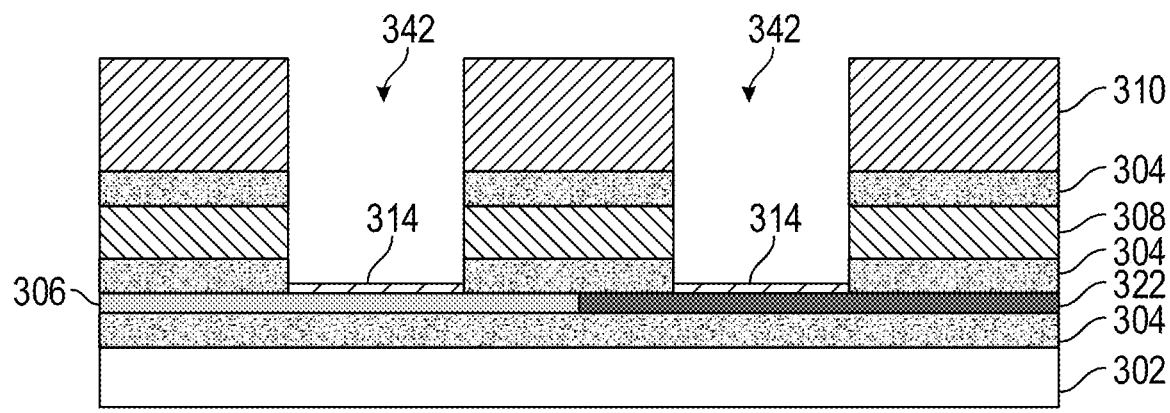
FIG. 3F is a cross-sectional substrate segment showing a third dielectric formed in the openings, according to an embodiment of the present disclosure.
Figure 3G:
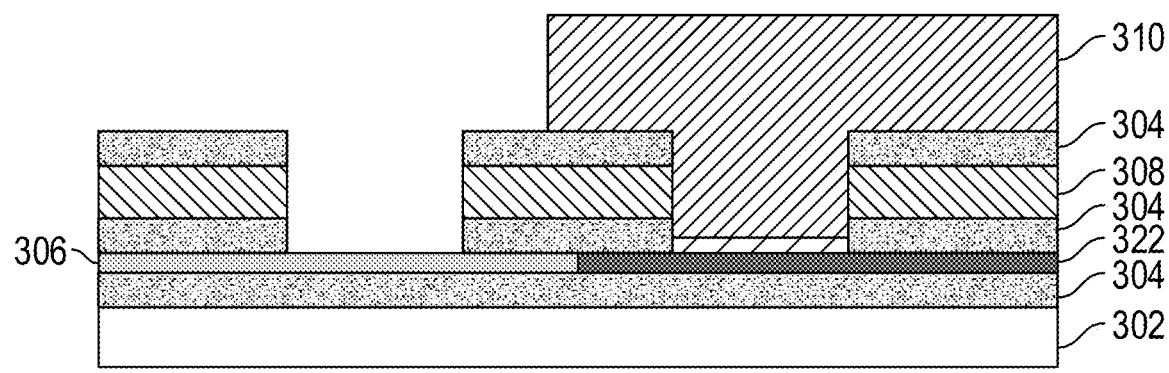
FIG. 3G is a cross-sectional substrate segment showing the third dielectric removed from the NMOS regions, according to an embodiment of the present disclosure.
Figure 3H:
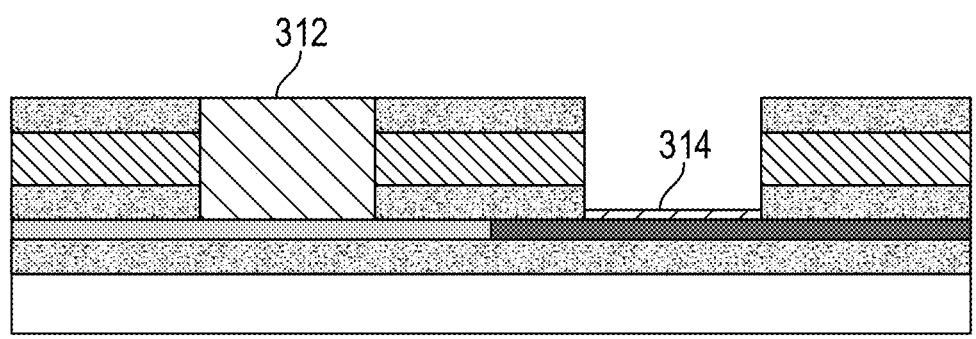
FIG. 3H is a cross-sectional substrate segment showing N+ channel regions epitaxially grown while PMOS regions are protected, according to an embodiment of the present disclosure.
Figure 3I:
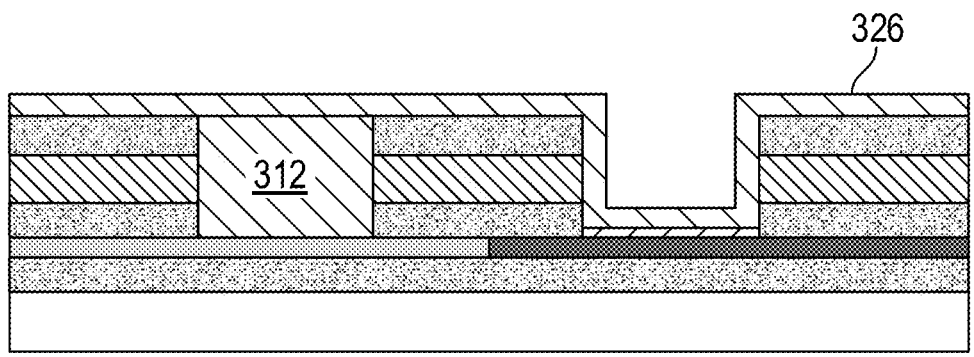
FIG. 3I is a cross-sectional substrate segment showing a protection film deposited on the substrate, according to an embodiment of the present disclosure.
Figure 3J:
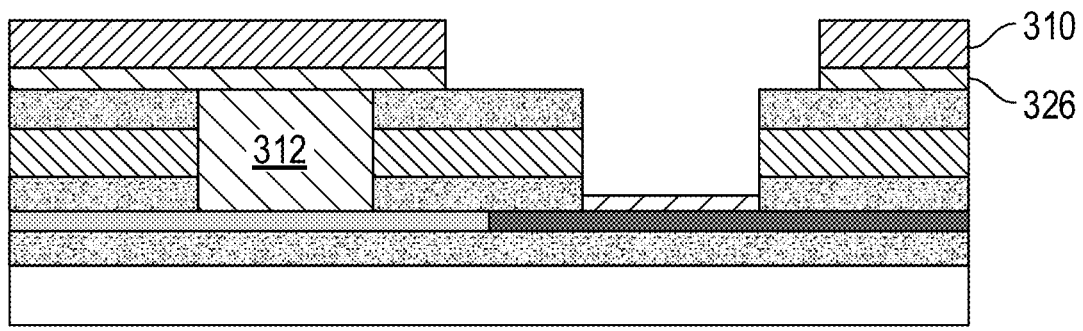
FIG. 3J is a cross-sectional substrate segment showing the protection film removed from the PMOS regions, according to an embodiment of the present disclosure.
Figure 3K:
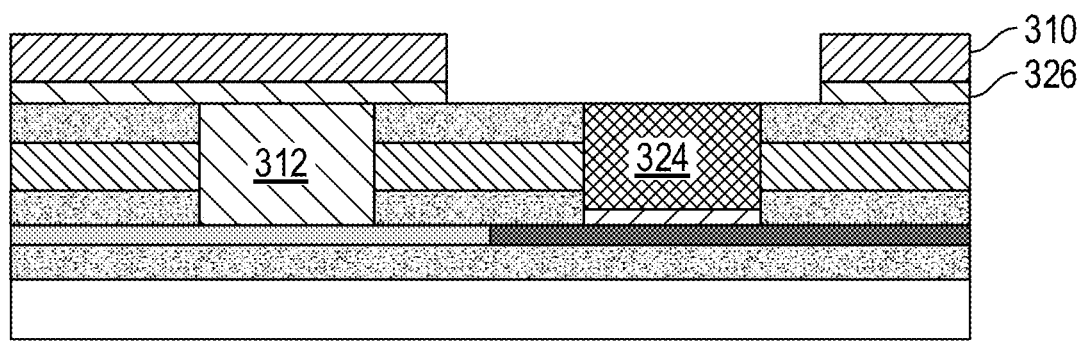
FIG. 3K is a cross-sectional substrate segment showing epitaxial growth of P+ vertical channel material, according to an embodiment of the present disclosure.
Figure 3L:
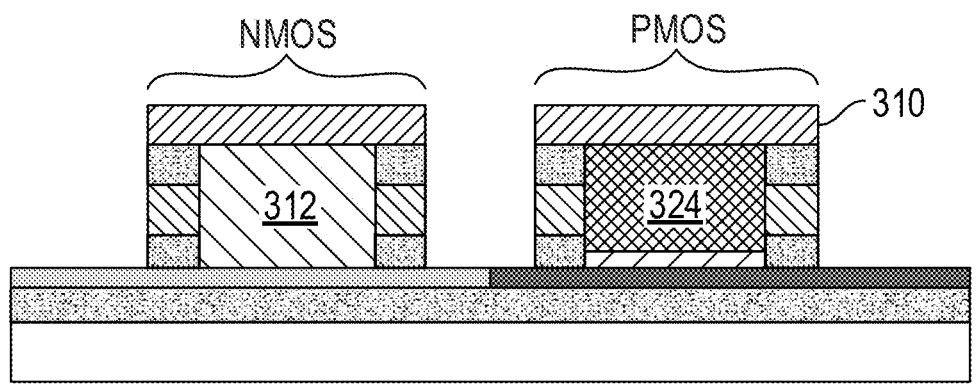
FIG. 3L is a cross-sectional substrate segment showing masking of the PMOS and NMOS regions and etching of the dielectric stack to form sidewall structures around the vertical channels, according to an embodiment of the present disclosure.
Figure 3M:
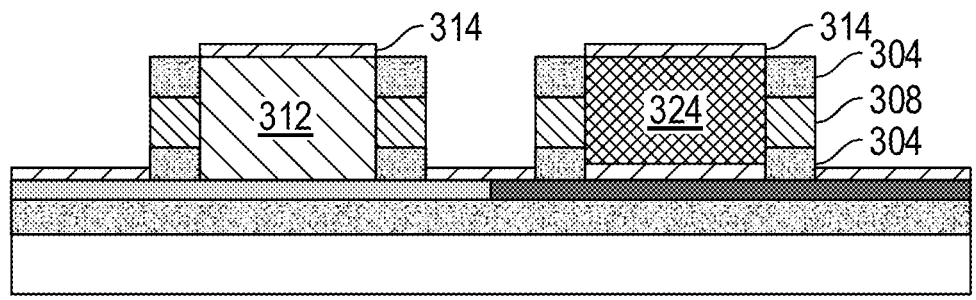
FIG. 3M is a cross-sectional substrate segment showing growth or selective deposition of the third dielectric on open substrate regions and N+ and P+ regions, according to an embodiment of the present disclosure.
Figure 3N:
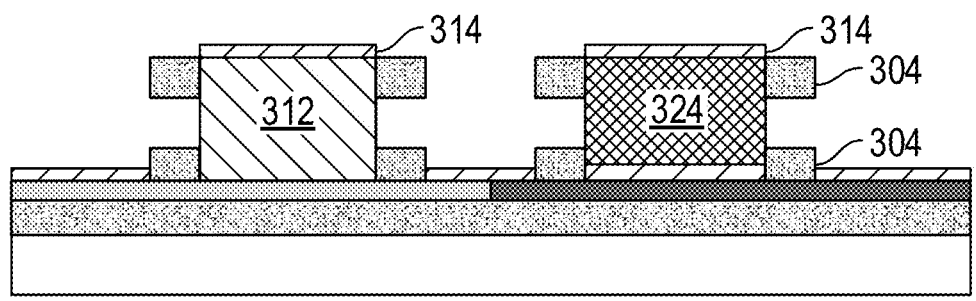
FIG. 3N is a cross-sectional substrate segment showing the second dielectric is removed without removing the first dielectric or the third dielectric to uncover future gate electrode regions, according to an embodiment of the present disclosure.
Figure 3O:
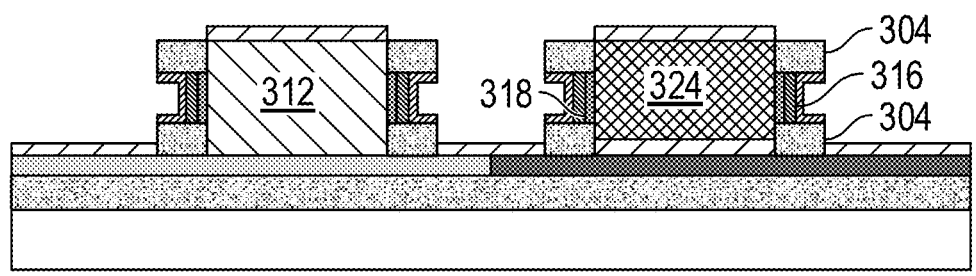
FIG. 3O is a cross-sectional substrate segment showing deposition of a high-K dielectric, annealing, and interfacial oxide growth formed between the high-K deposit and the vertical channels, according to an embodiment of the present disclosure.
Figure 3P:
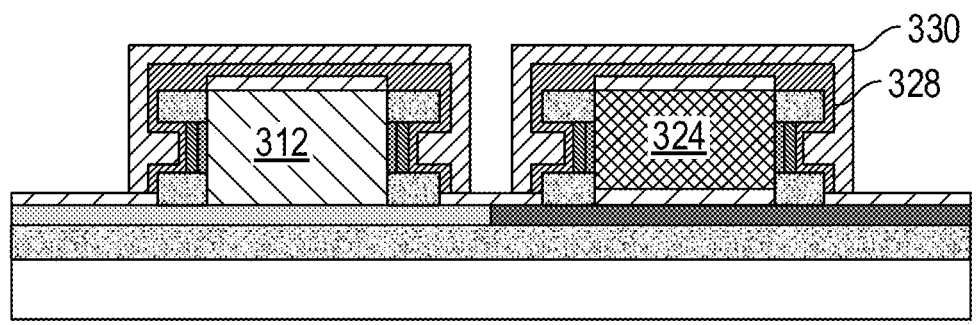
FIG. 3P is a cross-sectional substrate segment showing formation of a metal gate electrode stack, according to an embodiment of the present disclosure.
Figure 3Q:
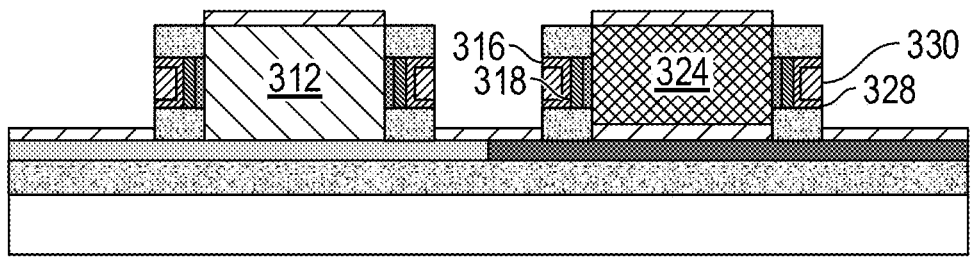
FIG. 3Q is a cross-sectional substrate segment showing directional etching executed to remove gate stack material from the substrate, leaving gate stack materials surrounding the vertical channel, according to an embodiment of the present disclosure.
Figure 3R:
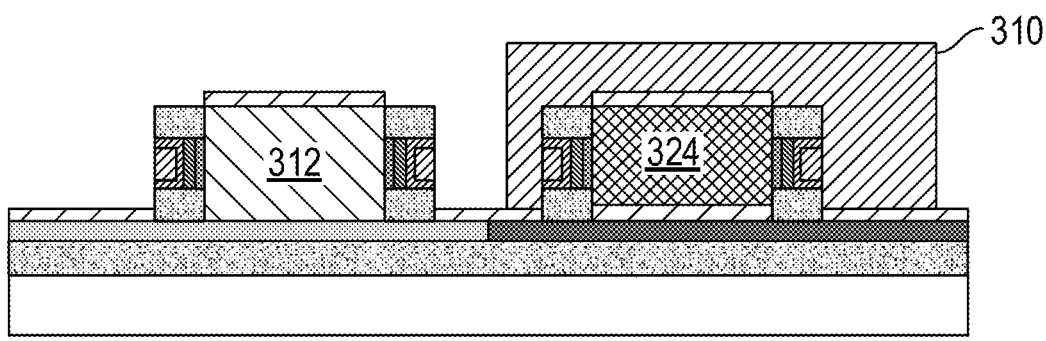
FIG. 3R is a cross-sectional substrate segment showing according to an embodiment of the present disclosure.
Figure 3S:
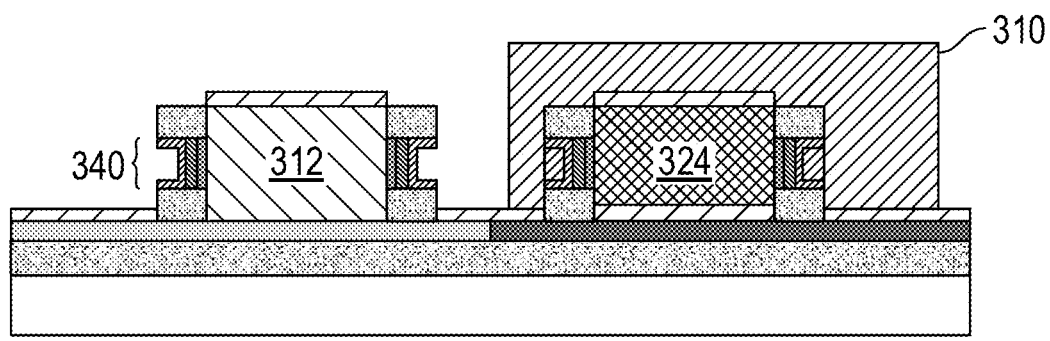
FIG. 3S is a cross-sectional substrate segment showing removal of a TiAl layer from the PMOS regions, according to an embodiment of the present disclosure.

In FIG. 2A, on the bulk substrate 202 material, a dielectric oxide 204 is deposited, then a layer of semiconductor material 222 is deposited on the oxide. It can be deposited as amorphous and then crystallized by bake or laser anneal. This layer can be formed with P+ dopants or implanted with P+ dopants. The P+ dopants can be boron, gallium, indium or other P+ semiconductor material. Above this semiconductor layer, a dielectric layer stack is formed of alternating layers. The dielectric layer stack at least includes top and bottom layers of dielectric oxide 204 isolating a second dielectric 208.

Figure 2B:
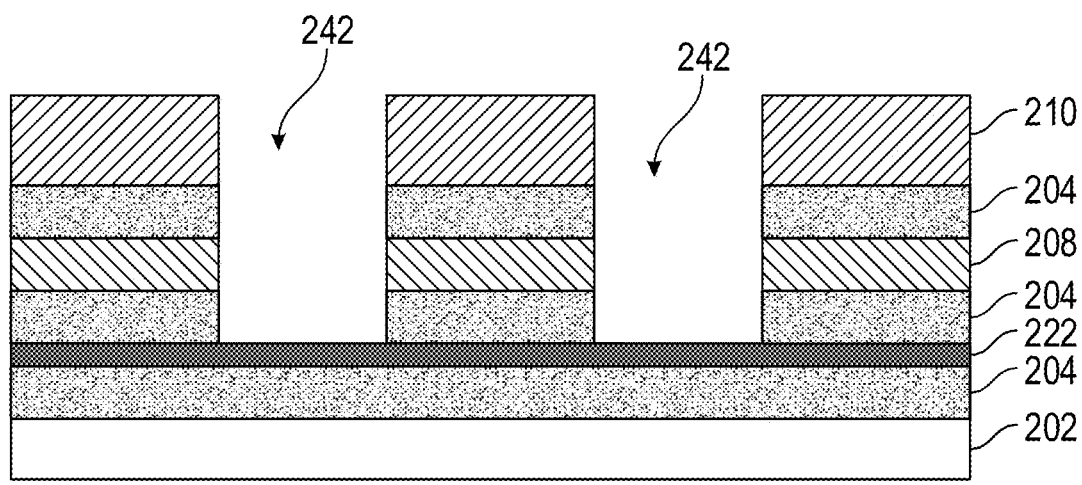
FIG. 2B is a cross-sectional substrate segment showing the formation of an etch mask to define openings in the layer stack, according to an embodiment of the present disclosure.

In FIG. 2B, photoresist 210 is patterned on top layer 204 to define openings to etch channel regions 242. These openings may be rectangular or cylindrical.

Figure 2C:
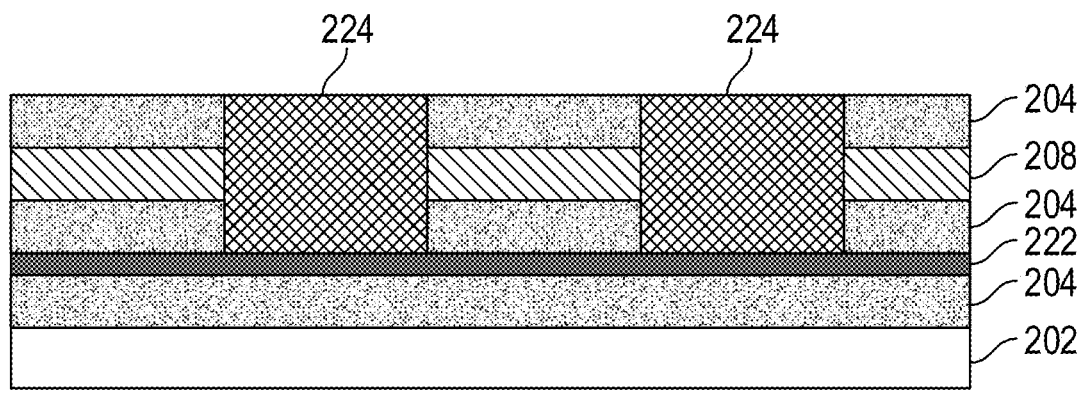
FIG. 2C is a cross-sectional substrate segment showing the epitaxial growth of P+ channel material in the openings, according to an embodiment of the present disclosure.

In FIG. 2C, with the P+ material uncovered within openings, P+ channel material 224 can be epitaxially grown.

Figure 2D:
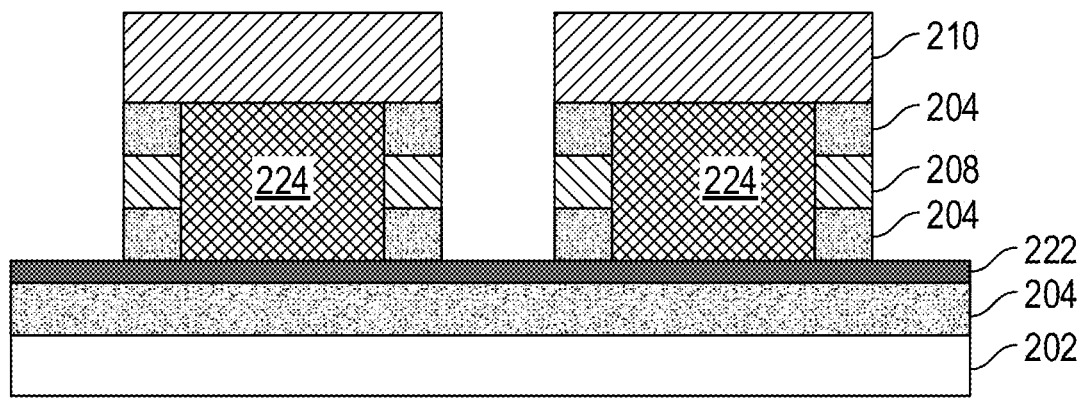
FIG. 2D is a cross-sectional substrate segment showing a second etch mask formed to define sidewall structures around the epitaxially grown vertical channels, according to an embodiment of the present disclosure.

FIG. 2D, photoresist 210 is patterned over the P+ material and to define sidewall structures around the epitaxially grown vertical channels 224. An etch is executed leaving sidewall structures on the vertical channels. The sidewall structures have a particular thickness and keep the alternating dielectric layer stack, essentially surrounding the vertical channel. This etch defines a future gate electrode region.

Figure 2E:
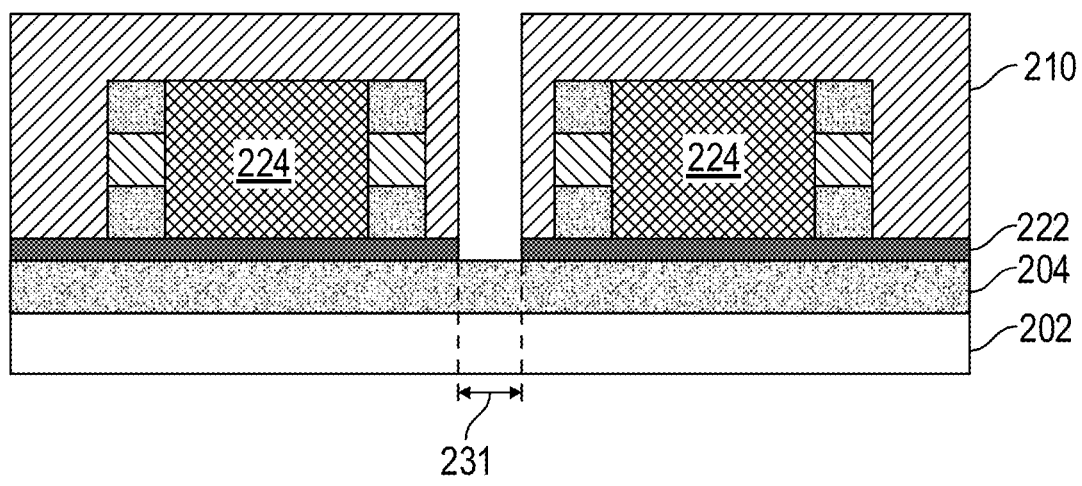
FIG. 2E is a cross-sectional substrate segment showing an optional etch through the P+ silicon layer to isolate the devices, according to an embodiment of the present disclosure.

In FIG. 2E, the existing photoresist 210 from FIG. 2D is removed and a new pattern of photoresist 210 is applied to etch through the P+ silicon layer to isolate each device at opening 231. This isolates each device for maximum circuit applications. This step is optional. In other embodiments, the photoresist mask 210 for defining the sidewall structures of FIG. 2D can also be used to isolate the P+ silicon.

Figure 2F:
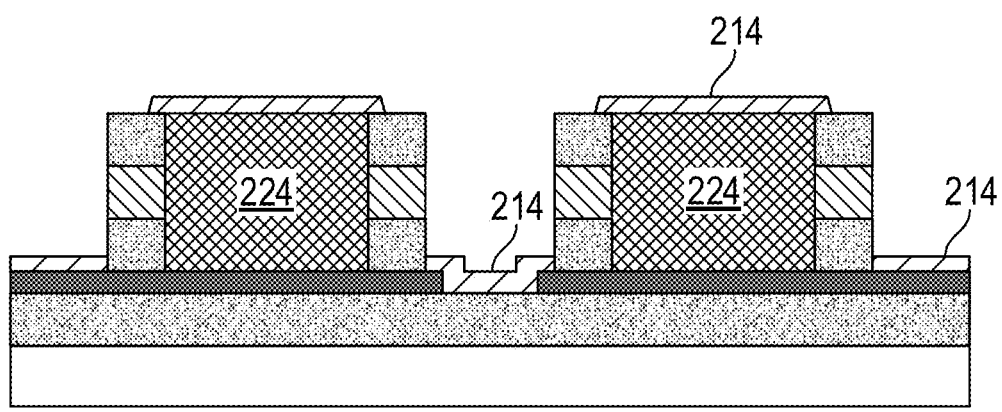
FIG. 2F is a cross-sectional substrate segment showing a third dielectric grown or selectively deposited on open substrate regions and P+ regions, according to an embodiment of the present disclosure.

In FIG. 2F, the photoresist 210 of FIG. 2E has been removed and a third dielectric 214 is grown or selectively deposited on open substrate regions and P+ regions. The third dielectric 214 should be etch selective to the second dielectric 208.

Figure 2G:
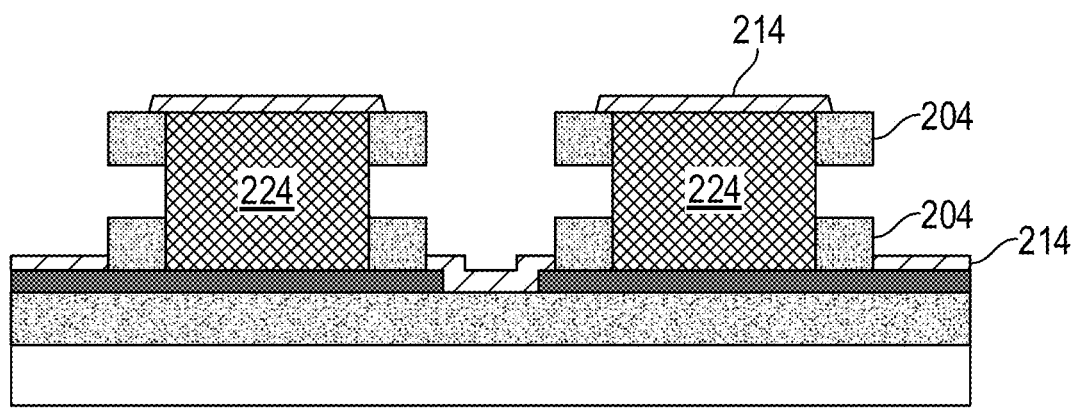
FIG. 2G is a cross-sectional substrate segment showing removal of the second dielectric, according to an embodiment of the present disclosure.

In FIG. 2G, the second dielectric 208 is removed without removing the top and bottom layers of dielectric oxide 204 or the third dielectric 214. This uncovers future gate electrode regions.

Figure 2H:
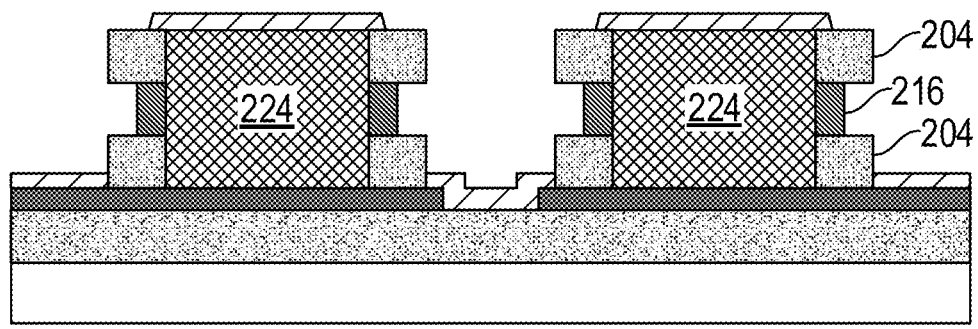
FIG. 2H is a cross-sectional substrate segment showing deposition of a selective high-K layer in the gate regions, according to an embodiment of the present disclosure.

In FIG. 2H, any sacrificial oxide or interface oxide growth can be removed or cleaned from the future electrode regions followed by deposition of a selective high-K layer 216 in the gate region on the vertical channel material 224 between the layers of the first dielectric 304.

Figure 2I:
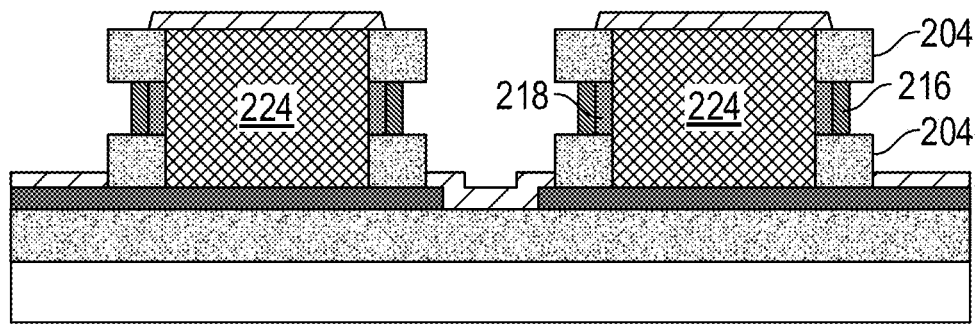
FIG. 2I is a cross-sectional substrate segment showing a selective high-K anneal step forming interfacial oxide growth in the gate regions, according to an embodiment of the present disclosure.

In FIG. 2I, a selective high-K anneal step can be executed. Interfacial oxide growth 218 can be formed between the high-K layer and the vertical channel.

Figure 2J:
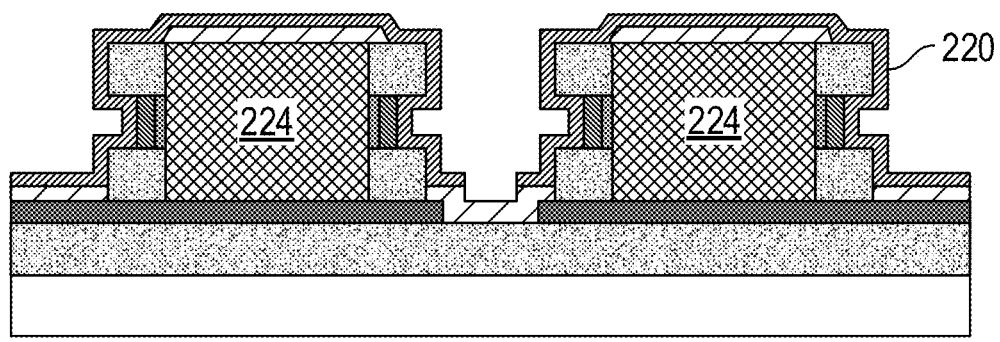
FIG. 2J is a cross-sectional substrate segment showing formation of a metal gate electrode stack, according to an embodiment of the present disclosure.

In FIG. 2J, a metal gate electrode stack 220 can be formed/deposited on the substrate. This can be one layer or multiple layers to adjust the voltage threshold ($V_t$) of the transistor device. This can be a conformal deposition.

Figure 2K:
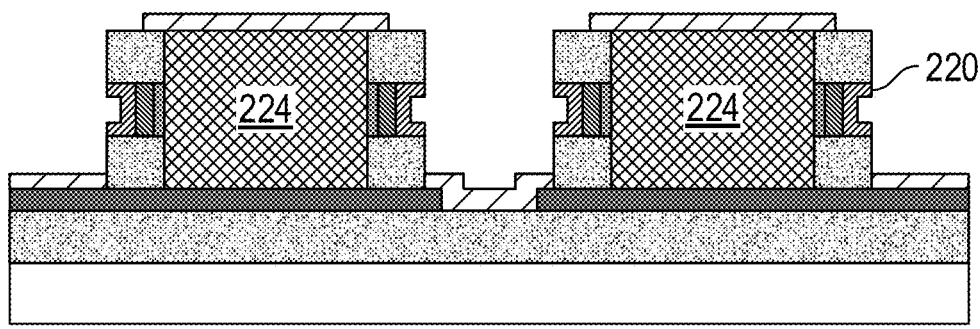
FIG. 2K is a cross-sectional substrate segment showing a directional etch removing gate stack material from the substrate, leaving gate stack materials surrounding the vertical channel to form a GAA device, according to an embodiment of the present disclosure.

In FIG. 2K, a directional etch is executed to remove metal gate electrode stack 220 from the substrate, top and sides, leaving only gate electrode stack materials within and surrounding the vertical channel, thereby forming a GAA device. Processing can then continue such as by forming local interconnects, LI (M0), Metal 1 or other connections (not shown). Additional vertical channel GAA devices can be formed on top of the layer of devices to repeat the fabrication process (not shown).

Figure 2L:
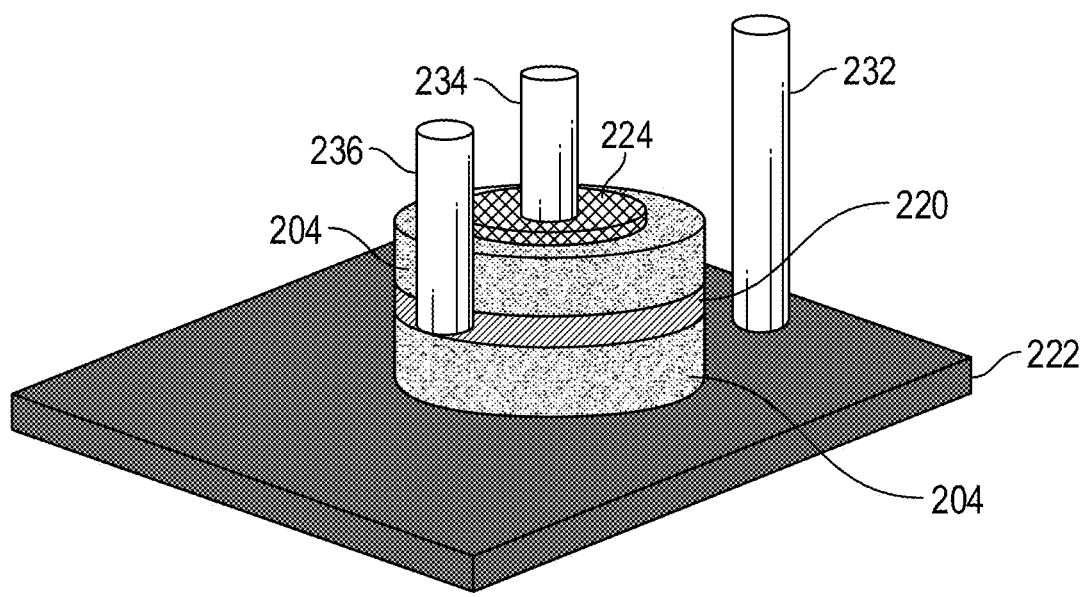
FIG. 2L is a perspective view of a PMOS GAA device with gate, source and drain connected to metal contacts, according to an embodiment of the present disclosure.

FIG. 2L is a perspective view of a device formed by the process of FIG. 2A-2K. FIG. 2L shows the first layer of semiconductor material 222, a layer of dielectric 204, the metal gate electrode stack 220, a layer of dielectric 204 and the P+ epitaxial vertical channel 224. Metal connections 232, 234 and 236 are attached to the first layer 222, the N+ epitaxial vertical channel 224 and the metal gate electrode stack 220 respectively.

Figure 3T:
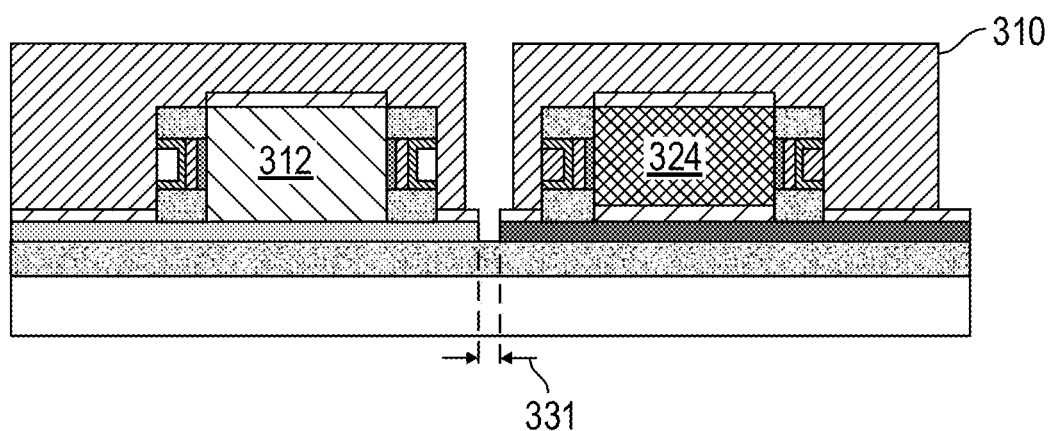
FIG. 3T is a cross-sectional substrate segment showing etching separations in the doped silicon layer to isolate the lower source/drain regions, according to an embodiment of the present disclosure.

FIGS. 3A-3T illustrate a process flow for formation of side-by-side vertical channel PFET and NFET devices.

In FIG. 3A, the processing flow starts with a substrate of single-crystal silicon 305 on dielectric layer 304 on silicon 302. A photomask of photoresist 310 can be formed to define areas for N+ implantation doping (phosphorous, arsenic . . . ) or plasma doping to form N+ layer 306.

In FIG. 3B, the photomask 310 of FIG. 3A is removed and a second mask of photoresist 310 covers N+ layer 306 to define areas for P+ dopant (e.g. BF2, B, . . . ) to form P+ layer 322. Although the N+ layer is shown on the left in FIG. 3A and the P+ layer is shown on the right in FIG. 3B, in other aspects the dopant areas can be reversed so that P+ is on the right and N+ is on the left.

FIG. 3C shows that doped semiconductor regions can optionally be separated and isolated at this point in the process flow. In this alternative, a photoresist pattern can be formed over the structure with an opening followed by an etch down to the dielectric layer 304.

In FIG. 3D, annealing of implants can be followed by depositing alternating layers 304, 308, 304, similar to previous flow. In a non-limiting example, dielectric layer 304 may be oxide and dielectric 108 may be a high-K dielectric.

In FIG. 3E, photoresist 310 can be patterned to provide regions in the dielectric layer stack which are etched down to the doped layer (either N+ or P+) to define openings 342 for vertical channels. These openings can be circular, square or rectangular. In a non-limiting example, the openings can be 10 nm in diameter and have heights of 5-50 angstroms.

In FIG. 3F, a third dielectric 314 can be grown or selectively deposited in substrate regions defined by openings 342. This can prevent epi growth in selective regions in subsequent process steps. The third dielectric 314 should be etch selective to the second dielectric 308.

In FIG. 3G, the PMOS regions (right stack) are masked, and the dielectric 314 is removed from NMOS regions (left stack).

In FIG. 3H, N+ channel regions 312 are epitaxially grown while PMOS regions are protected from epitaxial growth by third dielectric 314.

In FIG. 3I, the photoresist 310 is removed and a protection film 326 is deposited on the substrate, such as a conformal nitride to cover N+ epi regions.

In FIG. 3J, the protection film 326 is removed in the PMOS regions.

In FIG. 3K, P+ vertical channel material 324 is epitaxially grown. The P+ dopants can be boron, gallium, indium or other P+ semiconductor material. The remaining nitride is removed. At this point, both N+ and P+ vertical channels are completed.

In FIG. 3L, a photoresist mask 310 is patterned over the NMOS and PMOS regions and the dielectric layer stack is etched to form sidewall structures around the vertical channels.

FIG. 3M shows growth or selective deposition of the third dielectric 314 on open substrate regions and N+ and P+ regions. Dielectric 314 should be etch selective to the second dielectric 308.

In FIG. 3N, dielectric 308 is removed without removing dielectric 304 or dielectric 314. This uncovers future gate electrode regions.

In FIG. 3O, a sacrificial oxide or interface oxide growth (not shown) can be removed followed by pre-clean followed by selective high-K deposition 316. An anneal step can be executed. Interfacial oxide growth 318 can be formed between the high-K deposit 316 and the vertical channel.

In FIG. 3P, a metal gate electrode stack can be formed/deposited on the substrate. This can be one layer or multiple layers to adjust drive current of the transistor device. This can be a conformal deposition. The metal gate stack can be layers of titanium nitride (TiN) and tantalum nitride (TaN) gate metal 328 followed by a layer of titanium aluminide (TiAl) gate metal 330.

In FIG. 3Q, a directional etch is executed to remove gate stack material from the substrate, leaving gate stack materials (316, 318, 328, 330) surrounding the vertical channel, thereby forming a GAA device.

FIG. 3R shows that PMOS regions can be masked with photoresist 310 while TiAL (or other gate stack material) is removed for customization of gate stacks. For example, this can enable NMOS and PMOS to have a similar threshold voltage, Vt, in absolute value.

FIG. 3S shows the substrate cross-section with the different gate stacks after the removal of the metal gate material 328. The completed NMOS stack gate electrode region is shown as 340.

In FIG. 3T, a photoresist mask 310 can be formed on the substrate to etch separations 331 in the doped silicon layer to isolate the lower source/drain regions.

Figure 3U:
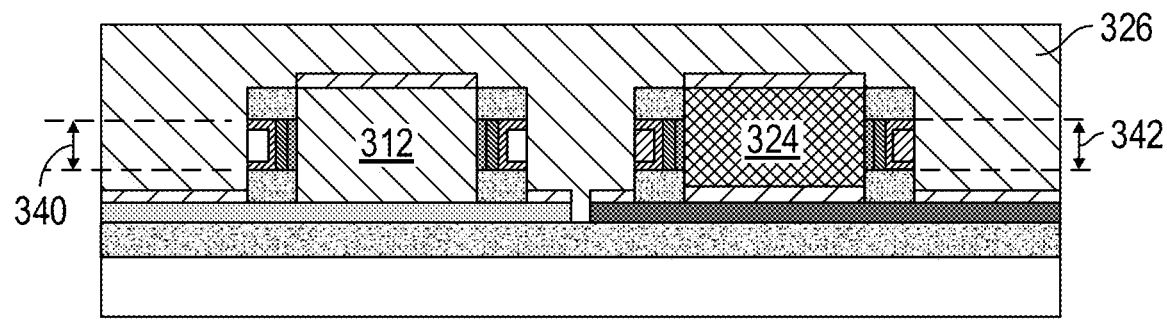
FIG. 3U is a cross-sectional substrate segment showing deposition of a dielectric covering, according to an embodiment of the present disclosure.
Figure 3V:
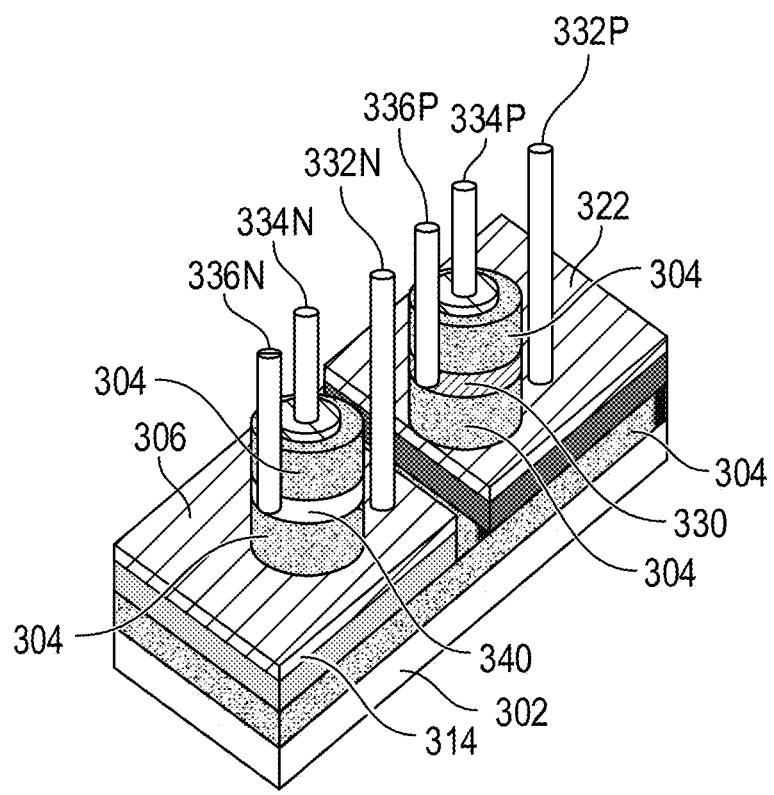
FIG. 3V is a perspective view of a NMOS device next to a PMOS device, with gates, source and drains connected to metal contacts, according to an embodiment of the present disclosure.

FIG. 3U shows the device with the photoresist mask 310 of FIG. 3T removed. A dielectric 326 is deposited and a chemical/mechanical polish/cross sectional polish is performed. The NMOS gate stack 340 and the PMOS gate stack 342 are shown.

FIG. 3V shows a perspective view of the side-by-side NMOS (on the left) and PMOS (on the right) stacks with metal connections. The NMOS stack has a gate electrode 336N connected to NMOS stack gate electrode region and electrodes 332N and 334N for source/drain connections. The PMOS stack has a gate electrode 336P connected to gate stack material 330 and electrodes 332P and 334P for source/drain connections.

The dielectric layer may be dielectric oxide or may be a low-K dielectric that has a K value less than $SiO_2$ (K=3.9), since metal routing will be done in these layers. Some non-limiting examples of low-K dielectrics are shown in Table 1:

TABLE 1

| Dielectric Constants (K) of Low K Dielectrics | |
|---|---|
| Oxide Derivatives | |
| F-doped oxides (CVD) | K = 3.3 – 3.9 |
| C-doped oxides (SOG, CVD) | K = 2.8 – 3.5 |
| H-doped oxides (SOG) | K = 2.5 – 3.3 |
| Organics | |
| Polymides (spin on) | K = 3.0 – 4.0 |
| Aromatic polymers (spin on) | K = 2.6 – 3.2 |
| Vapor deposited parylene; parylene-F | K~2.7; K~2.3 |
| F-doped amorphous carbon | K = 2.3 – 2.8 |
| Teflon/PTFE (spin on) | K = 1.9 – 2.1 |
| Highly Porous Oxides | |
| Xerogels/Aerogels | K = 1.8 – 2.5 |

Processing can then continue such as by forming local interconnects or other connections (not shown).

Additional vertical channel GAA devices (not shown) can be formed on top of the layer of devices to repeat the fabrication process. Furthermore, the source, drain and gate regions can be connected with conductive connections, for example, local interconnects and interconnects to metal levels. In one example, a buried power rail (power rail positioned below the channels) can be incorporated, wherein metal hookups can be obtained from either the top surfaces of the PMOS and NMOS transistors, or by using local interconnects.

Embodiments of the present disclosure may also be as set forth in the following parentheticals.

(1) A method of microfabrication, comprising: forming a stack of dielectric layers on a first layer of semiconductor material, the stack of dielectric layers having at least three layers in which a first dielectric material is positioned below and above a second dielectric material, the first dielectric material being different from the second dielectric material in that the second dielectric material can be removed without removing the first dielectric material; forming openings in the stack of dielectric layers such that the first layer of semiconductor material is uncovered; epitaxially growing channel material within uncovered openings to form vertical channels; removing a portion of the stack of dielectric layers such that sidewall structures remain on the vertical channels; removing the second dielectric material from the sidewall structures such that sidewall surfaces of the vertical channels are uncovered; and forming a gate structure on uncovered sidewall surfaces of the vertical channels.

(2) The method of (1), wherein the first layer of semiconductor material is N-doped silicon or N-doped germanium.

(3) The method of (1), wherein the first layer of semiconductor material is P-doped silicon or P-doped germanium.

(4) The method of (1), wherein the first layer of semiconductor material includes a P-doped region adjacent to an N-doped region, wherein N-doped vertical channels are grown in first uncovered openings over the N-doped region, and wherein P-doped vertical channels are grown in second uncovered openings over the P-doped region.

(5) The method of (4), further comprising: depositing a third dielectric on the first layer of the first and second uncovered openings; masking the P-doped region of the first layer with a first photoresist mask; removing the third dielectric from the N-doped region of the first layer; epitaxially growing N+ doped material over the N-doped region; removing the first photoresist mask; depositing a protection film over the stack of dielectric layers, the N+ doped material and the third dielectric; removing the protection film from the third dielectric; and epitaxially growing P+ doped material in the second uncovered opening over the third dielectric.

(6) The method of any one of (1) to (5), further comprising forming local interconnects that connect to the gate structure of each vertical channel, the vertical channels configured to conduct current perpendicular to a working surface of the first layer of semiconductor material.

(7) The method of any one of (1) to (6), further comprising removing portions of the first layer of semiconductor material between the vertical channels.

(8) The method of any one of (1) to (7), wherein the openings formed in the stack of dielectric layers have a circular or rectangular cross section.

(9) The method of any one of (1) to (8), wherein the first layer of semiconductor material is formed on an underlying dielectric layer.

(10) The method of any one of (1) to (9), wherein removing a portion of the stack of dielectric layers comprises: masking the vertical channels and a top of a sidewall region surrounding each vertical channel; and etching through the stack of dielectric layers down to the first layer of semiconductor material.

(11) The method of any one of (1) to (10), further comprising: forming the first layer of semiconductor material on an underlying dielectric layer; masking the stack of dielectric layers; and separating the stack by etching a portion of the stack down to the underlying dielectric layer prior to forming openings in the stack such that the first layer of semiconductor material is uncovered.

(12) The method of any one of (1) to (11), further comprising forming the gate structure by: depositing a selective high-K material within the uncovered sidewall surfaces of the vertical channels, annealing; forming interfacial oxide between the selective high-K material and the vertical channels; depositing a metal gate electrode stack on the vertical channels, sidewall surfaces and the selective high-K material; and removing the metal gate electrode stack from the vertical channels and sidewall surfaces.

(13) The method of any one of (1) to (12), wherein depositing a metal gate electrode stack comprises: depositing a first metal material on the selective high-K material; depositing a second metal material on the first metal material; and depositing a third metal material on the second metal material.

(14) The method of (13), wherein the first, second and third metal materials are different metals.

(15) The method of any one of (13) to (14), wherein the first metal material is titanium nitride, the second metal material is tantalum nitride and the third metal material is titanium aluminide.

(16) The method of any one of (13) to (15), wherein depositing a metal gate electrode stack comprises: depositing a first layer of a first metal material on the high-K material; depositing a second layer of a second metal material on the first layer of metal material; depositing a third layer of the first metal material on the second layer of the second metal material; depositing a fourth layer of the second metal material on the third layer of the first metal material; and depositing a third metal material on the fourth layer of the second metal material.

(17) A semiconductor device, comprising: a substrate layer; a layer of a first dielectric material; a layer of semiconductor material; a stack of dielectric layers having at least three layers in which the first dielectric material is positioned below and above a second dielectric material, the first dielectric material being different from the second dielectric material in that the second dielectric material can be removed without removing the first dielectric material; first openings in the stack of dielectric layers in which the layer of semiconductor material is uncovered; vertical channels having epitaxially grown doped material in the first openings; sidewall structures formed by second openings in the stack of dielectric layers between the vertical channels; third openings in the sidewall structures formed by removal of the second dielectric material to the vertical channel; gate structures in the third openings; and local interconnects connected to the gate structure of each vertical channel, the vertical channels configured to conduct current perpendicular to a working surface of the substrate layer.

(18) The semiconductor device of (17), wherein the first layer of semiconductor material is N-doped silicon or N-doped germanium.

(19) The semiconductor device of (17), wherein the first layer of semiconductor material is P-doped silicon or P-doped germanium.

(20) The semiconductor device of (17), wherein the first layer of semiconductor material includes a P-doped region adjacent to an N-doped region, wherein N-doped vertical channels are disposed in first uncovered openings over the N-doped region, and wherein P-doped vertical channels are disposed in second uncovered openings over the P-doped region.

Precise alignment with gate electrode is achieved with techniques herein. Vertical 3D epitaxial growth for vertical transistors enables current flow in the vertical dimension, which enables expansion of 3D device architectural designs. Vertical 3D structures provide readily accessible contacts (360 degree contact and routing access to channel, source and drain), thereby increasing circuit density. Embodiments and transistors herein can be stacked vertically for 3D devices. Embodiments enable the source and drain to be interchanged because each channel can be isolated from other channels.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

Obviously, numerous modifications and variations of the present invention are possible in light of the above teachings. It is therefore to be understood that within the scope of the appended claims, the invention may be practiced otherwise than as specifically described herein.

The invention claimed is:

1. A method of microfabrication, comprising:
    forming a stack of dielectric layers on a first layer of semiconductor material, the stack of dielectric layers having at least three layers in which a first dielectric material is positioned below and above a second dielectric material, the first dielectric material being different from the second dielectric material in that the second dielectric material can be removed without removing the first dielectric material;
    forming openings in the stack of dielectric layers such that the first layer of semiconductor material is uncovered;
    epitaxially growing channel material within uncovered openings to form vertical channels;
    removing a portion of the stack of dielectric layers such that sidewall structures remain on the vertical channels;
    removing the second dielectric material from the sidewall structures such that sidewall surfaces of the vertical channels are uncovered; and
    forming a gate structure on uncovered sidewall surfaces of the vertical channels.

2. The method of claim 1, wherein the first layer of semiconductor material is N-doped silicon or N-doped germanium.

3. The method of claim 1, wherein the first layer of semiconductor material is P-doped silicon or P-doped germanium.

4. The method of claim 1, wherein the first layer of semiconductor material includes a P-doped region adjacent to an N-doped region, wherein N-doped vertical channels are grown in first uncovered openings over the N-doped region, and wherein P-doped vertical channels are grown in second uncovered openings over the P-doped region.

5. The method of claim 4, further comprising:
    depositing a third dielectric on the first layer of semiconductor material in the first and second uncovered openings;
    masking the P-doped region of the first layer of semiconductor material with a first photoresist mask;
    removing the third dielectric from the N-doped region of the first layer of semiconductor material;
    epitaxially growing N+ doped material over the N-doped region;
    removing the first photoresist mask;
    depositing a protection film over the stack of dielectric layers, the N+ doped material and the third dielectric;
    removing the protection film from the third dielectric; and
    epitaxially growing P+ doped material in the second uncovered opening over the third dielectric.

6. The method of claim 1, further comprising forming local interconnects that connect to the gate structure of each vertical channel, the vertical channels configured to conduct current perpendicular to a working surface of the first layer of semiconductor material.

7. The method of claim 1, further comprising removing portions of the first layer of semiconductor material between the vertical channels.

8. The method of claim 1, wherein the openings formed in the stack of dielectric layers have a circular or rectangular cross section.

9. The method of claim 1, wherein the first layer of semiconductor material is formed on an underlying dielectric layer.

10. The method of claim 1, wherein removing a portion of the stack of dielectric layers comprises:
    masking the vertical channels and a top of a sidewall region surrounding each vertical channel; and
    etching through the stack of dielectric layers down to the first layer of semiconductor material.

11. The method of claim 1, further comprising:
    forming the first layer of semiconductor material on an underlying dielectric layer;
    masking the stack of dielectric layers; and
    separating the stack by etching a portion of the stack down to the underlying dielectric layer prior to forming openings in the stack such that the first layer of semiconductor material is uncovered.

12. The method of claim 1, further comprising forming the gate structure by:

depositing a selective high-K material within the uncovered sidewall surfaces of the vertical channels;

annealing;

forming interfacial oxide between the selective high-K material and the vertical channels; and depositing a metal gate electrode stack on the selective high-K material.

13. The method of claim 12, wherein depositing a metal gate electrode stack comprises:

depositing a first metal material on the selective high-K material;

depositing a second metal material on the first metal material; and depositing a third metal material on the second metal material.

14. The method of claim 13, wherein the first, second and third metal materials are different metals.

15. The method of claim 14, wherein the first metal material is titanium nitride, the second metal material is tantalum nitride and the third metal material is titanium aluminide.

16. The method of claim 12, wherein depositing a metal gate electrode stack comprises:

depositing a first layer of a first metal material on the high-K material;

depositing a second layer of a second metal material on the first layer of the first metal material;

depositing a third layer of the first metal material on the second layer of the second metal material;

depositing a fourth layer of the second metal material on the third layer of the first metal material; and depositing a third metal material on the fourth layer of the second metal material.

17. A semiconductor device, comprising:

a substrate layer;

a layer of a first dielectric material;

a layer of semiconductor material;

a stack of dielectric layers having at least three layers in which the first dielectric material is positioned below and above a second dielectric material, the first dielectric material being different from the second dielectric material in that the second dielectric material can be removed without removing the first dielectric material;

first openings in the stack of dielectric layers in which the layer of semiconductor material is uncovered;

vertical channels having epitaxially grown doped material in the first openings;

sidewall structures formed by second openings in the stack of dielectric layers between the vertical channels;

third openings in the sidewall structures formed by removal of the second dielectric material to the vertical channel;

gate structures in the third openings; and local interconnects connected to the gate structure of each vertical channel, the vertical channels configured to conduct current perpendicular to a working surface of the substrate.

18. The semiconductor device of claim 17, wherein the layer of semiconductor material is N-doped silicon or N-doped germanium.

19. The semiconductor device of claim 17, wherein the layer of semiconductor material is P-doped silicon or P-doped germanium.

20. The semiconductor device of claim 17, wherein the layer of semiconductor material includes a P-doped region adjacent to an N-doped region, wherein N-doped vertical channels are disposed in first uncovered openings over the N-doped region, and wherein P-doped vertical channels are disposed in second uncovered openings over the P-doped region.

* * * * *

UNITED STATES PATENT AND TRADEMARK OFFICE
CERTIFICATE OF CORRECTION

| | | |
|---|---|---|
| PATENT NO. | : 11,695,058 B2 | Page 1 of 1 |
| APPLICATION NO. | : 17/189674 | |
| DATED | : July 4, 2023 | |
| INVENTOR(S) | : Gardner et al. | |

It is certified that error appears in the above-identified patent and that said Letters Patent is hereby corrected as shown below:

On the Title Page

Item (57), under "ABSTRACT", Line 2, delete "device sand" and insert -- devices and --, therefor.

Item (57), under "ABSTRACT", Line 11, delete "connect" and insert -- connected --, therefor.

Signed and Sealed this
Sixth Day of February, 2024

Katherine Kelly Vidal
*Director of the United States Patent and Trademark Office*